United States Patent
Yamamoto et al.

(10) Patent No.: US 10,141,658 B2
(45) Date of Patent: Nov. 27, 2018

(54) ANTENNA MODULE

(71) Applicant: Panasonic Intellectual Property Management Co., Ltd., Osaka (JP)

(72) Inventors: Chie Yamamoto, Kanagawa (JP); Hideki Iwaki, Kanagawa (JP); Ryosuke Shiozaki, Tokyo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 38 days.

(21) Appl. No.: 15/603,062

(22) Filed: May 23, 2017

(65) Prior Publication Data
US 2017/0346195 A1 Nov. 30, 2017

(30) Foreign Application Priority Data

May 31, 2016 (JP) .................................. 2016-108984

(51) Int. Cl.
*H01Q 21/00* (2006.01)
*H01Q 21/22* (2006.01)
(Continued)

(52) U.S. Cl.
CPC ............. *H01Q 21/22* (2013.01); *H01Q 1/38* (2013.01); *H01Q 3/34* (2013.01); *H01Q 9/045* (2013.01);
(Continued)

(58) Field of Classification Search
CPC .......... H01Q 1/32–1/3233; H01Q 1/38; H01Q 21/00–21/0093; H01Q 21/06–21/061
See application file for complete search history.

(56) References Cited

U.S. PATENT DOCUMENTS 7,852,281 B2 * 12/2010 Choudhury .......... H01Q 1/2291
343/700 MS
9,196,951 B2 * 11/2015 Baks .................... H01Q 1/2283
(Continued)

FOREIGN PATENT DOCUMENTS

JP 2007-158555 A 6/2007
WO 2006/065539 A2 6/2006

OTHER PUBLICATIONS

Extended European Search Report, dated Oct. 17, 2017, for the related European Patent Application No. 17171760.6-1927, 9 pages.

*Primary Examiner* — Dameon E Levi
*Assistant Examiner* — Hasan Z Islam
(74) *Attorney, Agent, or Firm* — Seed IP Law Group LLP

(57) ABSTRACT

An antenna module includes a multilayer board, a phased array antenna that includes antenna elements arranged on an outer face of a second conductor layer included in the multilayer board and adjusts one or more beam directions of the antenna elements, a radio frequency (RF) chip that is arranged on an outer face of first conductor layers included in the multilayer board and outputs the radio frequency signal, a matching circuit that is arranged on the outer face of the first conductor layers and adjusts matching between impedance of the antenna elements and impedance of the RF chip, a through hole that couples the first conductor layers and the second conductor layer, and one or more vias that are on an outer side in a diameter direction of the through hole and couples the first conductor layers.

8 Claims, 6 Drawing Sheets

(51) Int. Cl.
*H01Q 1/38* (2006.01)
*H01Q 3/34* (2006.01)
*H01Q 9/04* (2006.01)
*H05K 1/02* (2006.01)
H01P 5/02 (2006.01)
H01Q 1/32 (2006.01)
H01Q 11/04 (2006.01)
H01Q 21/06 (2006.01)
H01Q 21/08 (2006.01)
H05K 1/03 (2006.01)
H05K 3/46 (2006.01)

(52) U.S. Cl.
CPC ....... *H01Q 9/0457* (2013.01); *H01Q 21/0075* (2013.01); *H01Q 21/0093* (2013.01); *H05K 1/0222* (2013.01); *H05K 1/0251* (2013.01); H01P 5/028 (2013.01); H01Q 1/3233 (2013.01); H01Q 11/04 (2013.01); H01Q 21/065 (2013.01); H01Q 21/08 (2013.01); H05K 1/0243 (2013.01); H05K 1/0373 (2013.01); H05K 3/4626 (2013.01)

(56) References Cited

U.S. PATENT DOCUMENTS

| | | |
|---|---|---|
| 2012/0026043 A1 | 2/2012 | Rida et al. |
| 2014/0209356 A1 | 7/2014 | Sakai et al. |

\* cited by examiner

ANTENNA MODULE

BACKGROUND

1. Technical Field

The present disclosure relates to antenna modules and for example, relates to small-sized antenna modules that include phased array antennas, where transmission loss is decreased.

2. Description of the Related Art

Automobile millimeter wave radars that use the millimeter wave band of frequencies from 30 to 300 GHz have been more and more widespread in recent years. Such millimeter wave radars detect distances between the millimeter wave radars and detected objects, directions (angles) based on the millimeter wave radars where the detected objects are present, and speeds relative to the detected objects by emitting radio waves in the millimeter wave band from antennas, receiving reflected waves thereof, and processing signals. Thus, development of techniques for reducing car crashes and accidents involving pedestrians and decrease in costs are under review. Since the factors that make millimeter wave radars widespread include reduction in costs, it is under review to apply printed boards that are inexpensive and excellent in mass productivity to antenna modules where radio frequency (RF) chips to perform communication for the transmission and reception of millimeter waves are mounted.

For example, Japanese Unexamined Patent Application Publication (Translation of PCT Application) No. 2008-524845 discloses techniques of controlling the intrinsic impedance of through holes formed on a printed board and arranging vias into a through hole configuration with a coaxial structure so as to reduce transmission loss between antenna elements and transmission or reception integrated circuits (ICs).

According to the techniques described in Japanese Unexamined Patent Application Publication (Translation of PCT Application) No. 2008-524845, however, when a plurality of antenna elements formed of wiring patterns are arranged on an outer layer of a board, the arrangement needs to avoid vias with a coaxial structure and it is thus difficult to arrange the antenna elements with efficiency and costs are raised because of increase in area of the board.

SUMMARY

One non-limiting and exemplary embodiment facilitates providing an antenna module including a plurality of antenna elements, where deficiencies in the plurality of antenna elements can be controlled, restraint-free arrangement with efficiency is enabled as well as downsizing, and transmission loss between an RF chip and the antenna elements can be decreased.

In one general aspect, the techniques disclosed here feature an antenna module including a multilayer board, a phased array antenna that includes a plurality of antenna elements arranged on an outer face of a second conductor layer included in the multilayer board and adjusts one or more beam directions of the plurality of antenna elements by controlling a phase of each of radio frequency signals transmitted from the plurality of antenna elements, a radio frequency (RF) chip that is arranged on an outer face of a plurality of first conductor layers included in the multilayer board and outputs the radio frequency signal, a matching circuit that is arranged on the outer face of the plurality of first conductor layers and adjusts matching between impedance of the plurality of antenna elements and impedance of the RF chip, a through hole that couples the plurality of first conductor layers and the second conductor layer, and one or more vias that are on an outer side in a diameter direction of the through hole and couples the plurality of first conductor layers.

According to the present disclosure, in an antenna module including a plurality of antenna elements, deficiencies in the plurality of antenna elements can be controlled, restraint-free arrangement with efficiency is enabled as well as downsizing, and transmission loss between an RF chip and the antenna elements can be decreased.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Examples of antenna modules used in millimeter wave radars include those with antenna elements formed of wiring patterns. Such antenna elements are coupled to RF chips for millimeter wave communication through the wiring patterns on printed boards. To transfer millimeter wave signals output from a transmission RF chip to an antenna while inhibiting the attenuation of the power of the signals and emit the signals into space with efficiency, it is conceivable to reduce loss in coupling parts that couple the antenna elements and the transmission RF chip.

Similarly in a receiving process, to transfer reflected waves of millimeter wave signals, which have been received at the antenna, to a reception RF chip while inhibiting the attenuation of the waves, it is desired to reduce loss in coupling parts that couple the antenna elements and the reception RF chip. Power loss in coupling parts causes decrease in detection distance or detection range in millimeter wave radars.

Thus, to reduce power loss in coupling positions between antenna elements and a transmission or reception IC, intrinsic impedance in the coupling positions is controlled. The control of the intrinsic impedance is performed on vias that couple wiring patterns arranged between antenna elements and RF chips to layers of a board.

Figure 10:
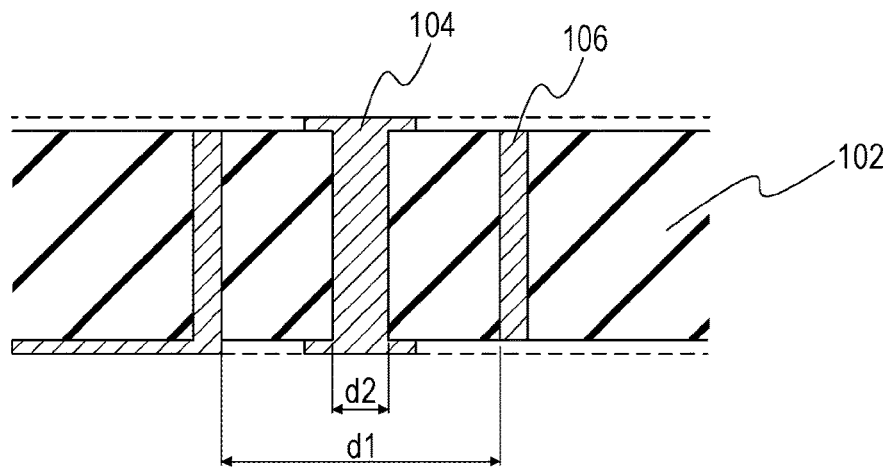
FIG. 10 is a cross-sectional view that illustrates an example of the configuration of a board having a conventional coaxial structure.
Figure 11:
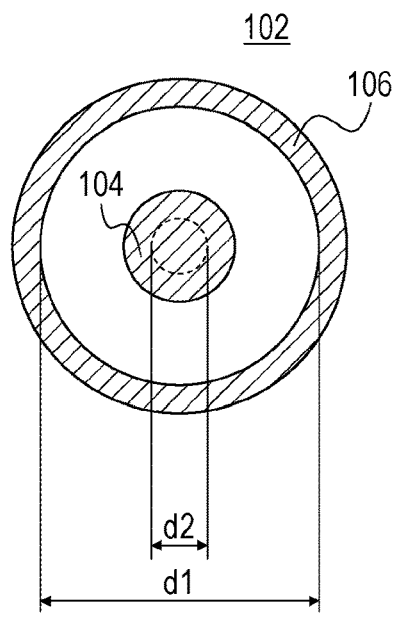
FIG. 11 is a plan view that illustrates an example of the configuration of a board having a conventional coaxial structure.

FIG. 10 is a cross-sectional view of the via configuration disclosed in Japanese Unexamined Patent Application Publication (Translation of PCT Application) No. 2008-524845 and FIG. 11 is a plan view of the via configuration disclosed in Japanese Unexamined Patent Application Publication (Translation of PCT Application) No. 2008-524845. The via configuration illustrated in FIGS. 10 and 11 is a through hole configuration that has a coaxial structure, and a through hole 104 and an impedance adjusting structure 106 each have a diameter adjusted to a desired impedance value. In regard to the through hole configuration with a coaxial structure illustrated in FIGS. 10 and 11, intrinsic impedance $Z_0$ ($\Omega$) can be expressed by mathematical expression (1) below, where $\in_r$ (dimensionless) represents the relative permittivity of an electrical insulation base 102, d2 (mm) represents the diameter of the through hole 104, and d1 (mm) represents the inside diameter of the impedance adjusting structure 106.

$$Z_0 \approx \frac{60}{\sqrt{\varepsilon_r}} \times \ln\frac{d1}{d2} \qquad (1)$$

According to the techniques described in Japanese Unexamined Patent Application Publication (Translation of PCT Application) No. 2008-524845, however, it is difficult to arrange antenna elements with efficiency, the area of the board increases, and costs rise.

Embodiments of the present disclosure are described below by referring to the drawings. In each embodiment, identical references are given to the constituents having identical functions and overlapping descriptions are omitted. All the drawings described below illustrate examples of configurations and to simplify the descriptions, the dimensions of each element are exaggeratedly indicated and when necessary, some elements are omitted in the illustrations.

First Embodiment

Figure 1:
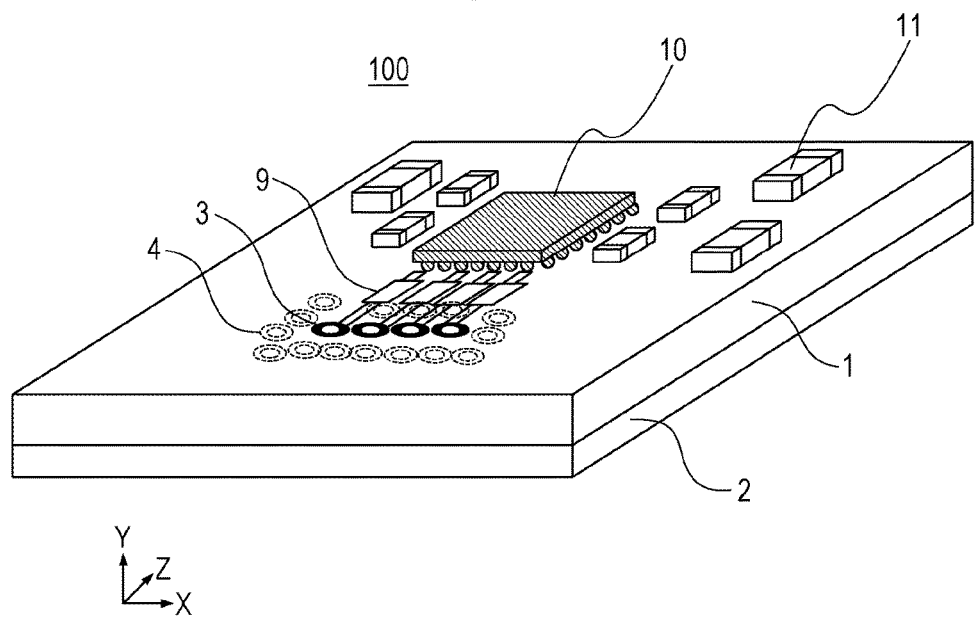
FIG. 1 is a top perspective view that illustrates an example of the configuration of an antenna module according to a first embodiment.
Figure 2:
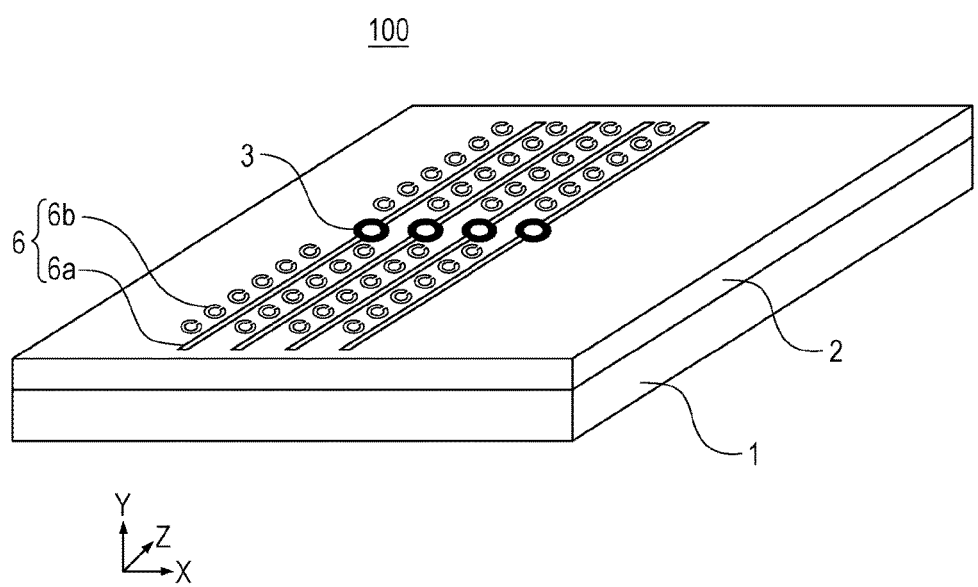
FIG. 2 is a bottom perspective view that illustrates an example of the configuration of the antenna module according to the first embodiment.
Figure 3:
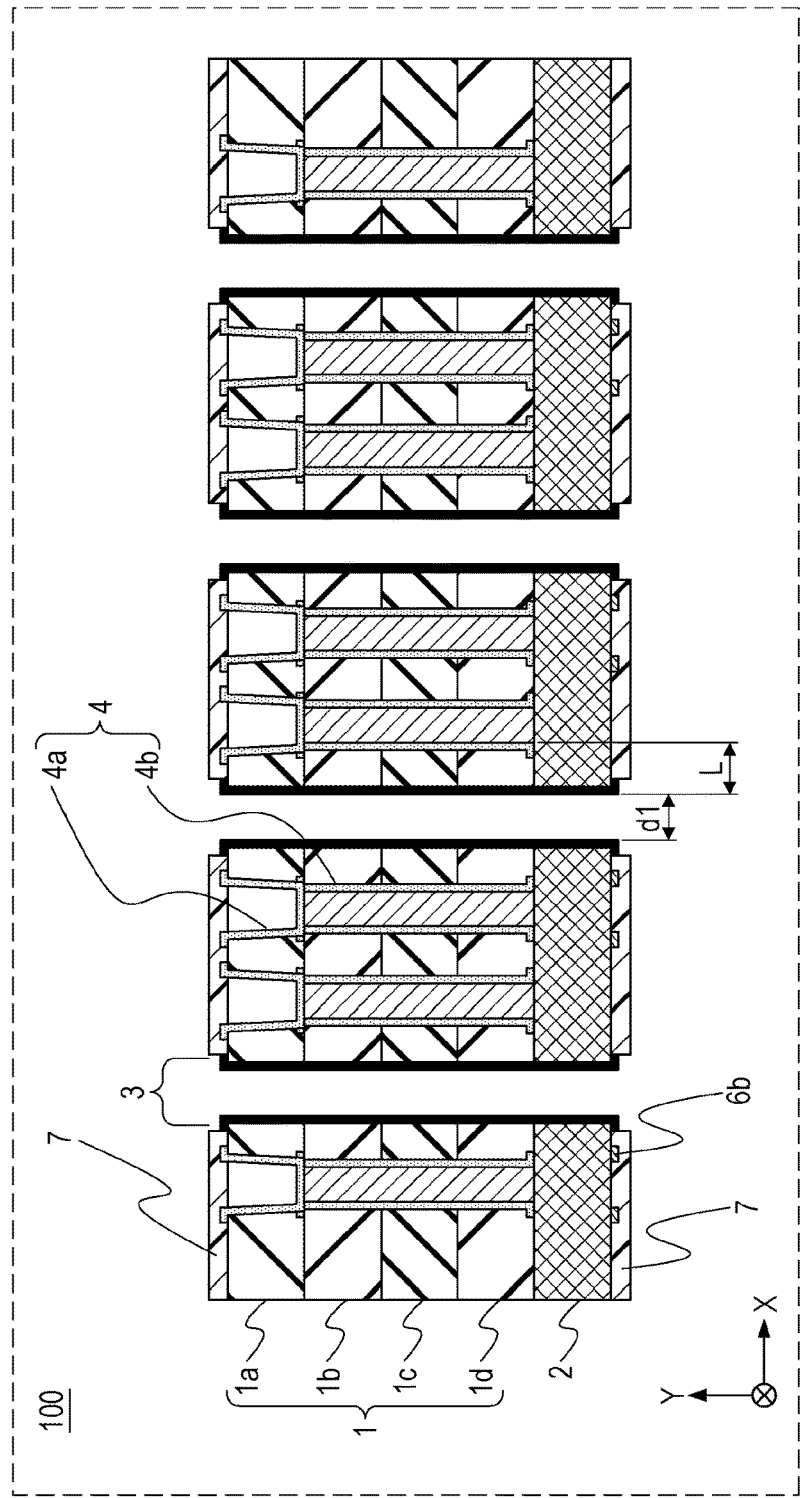
FIG. 3 is a cross-sectional view that illustrates an example of the configuration of the antenna module according to the first embodiment.
Figure 4:
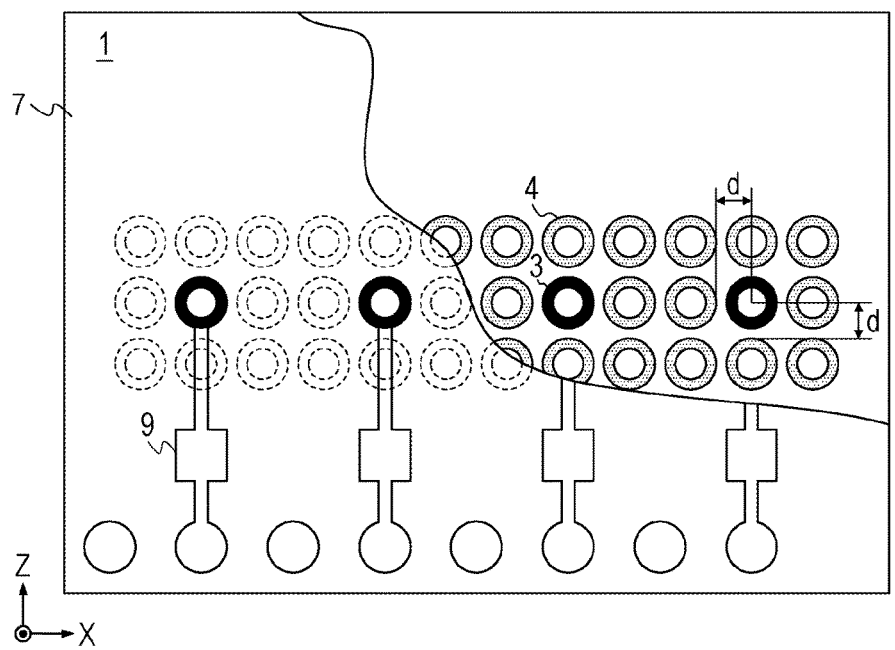
FIG. 4 is a top view that illustrates an example of the configuration of the antenna module according to the first embodiment.
Figure 5:
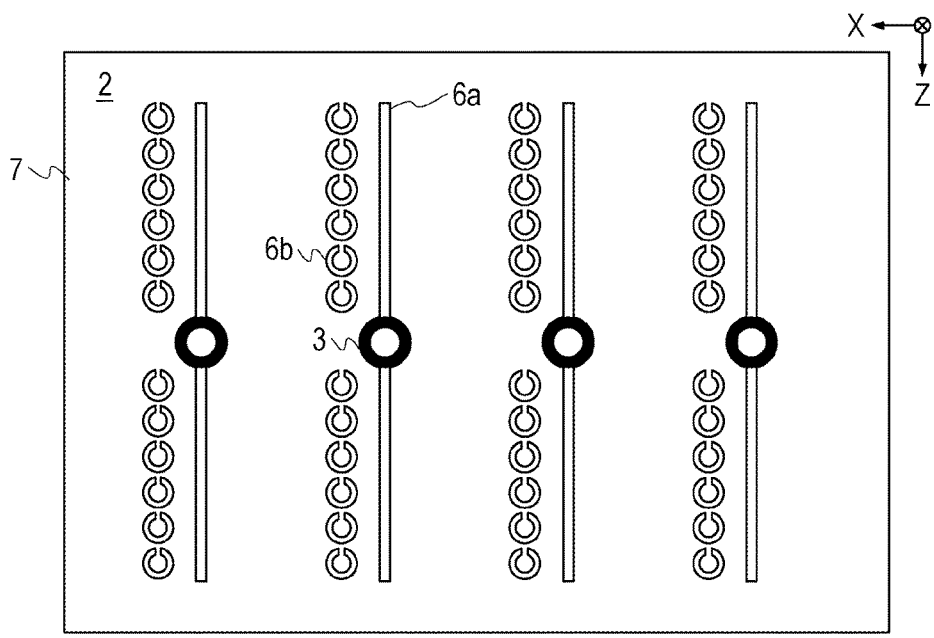
FIG. 5 is a bottom view that illustrates an example of the configuration of the antenna module according to the first embodiment.

FIG. 1 is a top perspective view that illustrates an example of the configuration of an antenna module 100. FIG. 2 is a bottom perspective view that illustrates an example of the configuration of the antenna module 100. FIG. 3 is a cross-sectional view that illustrates an example of the configuration of the antenna module 100. FIG. 4 is a top view that illustrates an example of the configuration of the antenna module 100. FIG. 5 is a bottom view that illustrates an example of the configuration of the antenna module 100. In FIGS. 1 to 5, the antenna module 100 includes a first laminate part 1, a second laminate part 2, a through hole 3, a via 4, a wiring (antenna) pattern 6, a solder resist 7, a matching circuit 9, an RF chip 10, and a circuit component 11.

In the description below, in the antenna module 100, the outer face of the first laminate part 1 is referred to as the obverse face of the antenna module 100 and the outer face of the second laminate part 2 is referred to as the reverse face of the antenna module 100. The lower side of FIG. 4 or the negative direction of the Z axis (that is, the upper side of FIG. 5 or the negative direction of the Z axis) is referred to as the front side, and the upper side of FIG. 4 or the positive direction of the Z axis (that is, the lower side of FIG. 5 or the positive direction of the Z axis) is referred to as the back side while the longitudinal direction (the Z axis direction) in FIGS. 4 and 5 is referred to as the depth direction. The lateral direction (the X axis direction) in FIGS. 4 and 5 is referred to as the width direction.

In the first laminate part 1, members like flat plates using a first electrical insulation base are laminated, and FIG. 3 illustrates that in the first laminate part 1, for example, a first laminate plate 1a, a second laminate plate 1b, a third laminate plate 1c, and a fourth laminate plate 1d are laminated sequentially from the obverse face of the antenna module 100 toward the reverse face of the antenna module 100 in the negative direction of the Y axis.

Examples of the first electrical insulation base that forms the first laminate part 1 include materials with favorable frequency response to high frequencies, which are for example, higher than or equal to those in a microwave band, such as a polyphenylene ether (PPE) base that uses PPE resin, a polytetrafluoroethylene (PTFE) base that uses PTFE resin, liquid crystal polymer (LCP), and polyimide (PI).

As the first electrical insulation base that forms the first laminate part 1, for example, a glass epoxy resin base or a composite material including thermosetting resin, thermoplastic resin, and an inorganic filler may be used. Examples of the thermosetting resin include epoxy resin. As the inorganic filler added, for example, a filler such as $Al_2O_3$, $SiO_2$, MgO, or AlN may be used.

The second laminate part 2 is a member like a flat plate using a second electrical insulation base and is laminated on the reverse face of the first laminate part 1. In FIG. 3, the second laminate part 2 is laminated on the reverse face of the fourth laminate plate 1d.

Similar to the first electrical insulation base, examples of the second electrical insulation base that forms the second laminate part 2 include materials with favorable frequency response to high frequencies, such as a PPE base that uses PPE resin, a PTFE base that uses PTFE resin, LCP, and PI.

As the second electrical insulation base that forms the second laminate part 2, for example, a glass epoxy resin base or a composite material including thermosetting resin, thermoplastic resin, and an inorganic filler may be used. Examples of the thermosetting resin include epoxy resin. As the inorganic filler added, for example, a filler such as $Al_2O_3$, $SiO_2$, MgO, or AlN may be used.

The first electrical insulation base that forms the first laminate part 1 and the second electrical insulation base that forms the second laminate part 2 are described as different bases.

The through holes 3 electrically couple the obverse face and reverse face of the antenna module 100 and are illustrated in FIG. 3 as vias formed by plating the wall faces of holes that penetrate from the obverse face to reverse face of the antenna module 100. The diameter of each through hole 3 is d1 mm.

The through holes 3 are formed as described below. In FIG. 3, for example, after the first laminate part 1 and the second laminate part 2 are laminated by hot pressing, holes are formed by drilling. When the wall faces of the holes are plated after that, the through holes 3 with conductivity are formed. The method of forming the through holes 3 is not limited thereto, and punching may be employed in addition to the drilling.

The vias 4 in FIG. 3 are formed as non-penetrating vias that have openings in the obverse face of the first laminate part 1, and as illustrated in FIG. 4, are formed so as to surround the through holes 3. The vias 4 are described in detail below.

In FIG. 5, the wiring patterns 6 are arranged on the outer face of the second laminate part 2 (the reverse face of the antenna module 100) and include a phased array antenna. When millimeter waveband communication is performed using this configuration, the transmission frequency and reception frequency of the phased array antenna are the same as each other.

The wiring patterns 6 are arranged as for example, four wiring pattern pairs, which are aligned in the width direction (the X axis direction) and are each constituted of a microstrip line 6a arranged like a straight line in the depth direction (the Z axis direction) and six antenna elements 6b arranged in parallel in the depth direction (the Z axis direction). The wiring patterns 6 adjusts one or more beam directions of the plurality of antenna elements 6b by controlling a phase of each of radio frequency signals transmitted from the plurality of antenna elements 6b. Although an example in which each wiring pattern 6 includes six antenna elements, 6b, is described, the number of antenna elements or their angles and arrangement positions are not limited to this example. For instance, each wiring pattern 6 may employ a configuration with more or less than six antenna elements, 6b. The angle of each antenna element may have any degrees and the arrangement positions of the antenna elements may employ a configuration in no alignment. Further, although an example in which four pairs of the wiring patterns 6 are arranged on the outer face of the second laminate part 2 is described, the number of pairs of the wiring patterns 6 arranged is not limited to four. For example, the wiring patterns 6 may be configured of more or less than four pairs on the outer face of the second laminate part 2.

In FIG. 5, the antenna elements 6b are loop antenna elements. Each antenna element may employ a known shape, such as a patch type. The microstrip lines 6a electrically coupled to the corresponding antenna elements 6b are coupled to the obverse face of the first laminate part 1 through the through holes 3 formed in central portions in the depth direction. In FIGS. 3 and 4, the outer face of the second laminate part 2 where the wiring patterns 6 are arranged is covered with the solder resist 7.

In FIG. 4, the matching circuits 9 are matching circuits that adjust deviation in impedance between the antenna elements 6b and the RF chip 10 described below. Each matching circuit 9 adjusts impedance deviation caused in a position in the antenna circuits, such as that caused in at least one of the input and output impedance in the antenna elements 6b, the microstrip lines 6a, the through holes 3, and the RF chip 10 to a desired value.

In FIGS. 1 and 4, the matching circuits 9 are arranged on the outer face of the first laminate part 1 and couple the through holes 3 and the RF chip 10. The matching circuits 9 are arranged like straight lines in the depth direction (the Z axis direction) and are coupled to the through holes 3 in back side portions while being coupled to the RF chip 10 in front side portions.

In FIG. 1, for example, the number of matching circuits, 9, is four so as to match the four wiring patterns described above. The outer face of the first laminate part 1 is covered with the solder resist 7 as illustrated in FIG. 3.

In FIG. 1, the RF chip 10 is assembled in a ball grid array (BGA) package and arranged on the outer face of the first laminate part 1. The RF chip 10 is coupled to the wiring patterns 6 through the matching circuits 9 and the through holes 3.

In assembling the RF chip 10 in the BGA package, an underfill, which is a filling material, may be formed around junctions between the solder balls of the BGA package and the outer face of the first laminate part 1. The underfill may cover part of the matching circuits 9. The underfill can alleviate stress and distortion applied to the junctions between the BGA package and the outer face of the first laminate part 1, and can enhance the reliability of the implementation.

In FIG. 1, the circuit components 11 are arranged on the outer face of the first laminate part 1. The detailed descriptions of the circuit components 11 are omitted as appropriate.

The via 4 with a non-penetrating structure is described using FIGS. 3 and 4.

In FIG. 4, a plurality of vias, 4, which each have a non-penetrating structure, are arranged with respect to each through hole 3 so as to surround the through hole 3.

In FIG. 3, each via 4 has a stack (pile) structure in which a microvia 4a and an inner via 4b are stacked. Instead of having a stack structure, the via 4 may be configured of the microvia 4a or the inner via 4b.

In FIG. 3, for example, each microvia 4a is a conformal via formed by plating the wall face of a hole that penetrates in the first laminate plate 1a. In FIG. 3, the microvias 4a are formed as described below. First, holes are formed in the first laminate plate 1a by laser machining for example. Subsequently, the wall faces of the holes are plated and then the microvias 4a with conductivity are formed.

As a light source of the laser machining, for example, a $CO_2$ laser, a yttrium aluminum garnet (YAG) laser, or an excimer laser is used. The use of the laser machining enables penetrating holes that each have a small diameter to be formed in a short time can achieve processing excellent in productivity.

The method of forming the microvias 4a is not limited thereto, and punching or drilling may be used instead of the laser machining. Instead of plating the wall face of a hole, a filled via may be formed by filling the entire hole with plating or the hole may be filled with a conductive paste.

Each inner via 4b is an inner via resulting from forming a hole that penetrates from the second laminate plate 1b to the fourth laminate plate 1d and plating the wall face of the hole. A conductive paste is filled in the hole that is plated. Accordingly, the stress caused by stacking (piling) the microvia 4a on the inner via 4b can be alleviated and the reliability of the inner via 4b can be enhanced.

In FIG. 3, each inner via 4b is stacked on each microvia 4a on an identical axis. Thus, poor coupling caused in coupling the microvia 4a and the inner via 4b can be inhibited and the reliability of the antenna module 100 can be enhanced.

In FIG. 3, for example, the diameter of the hole that forms the inner via 4b is approximately equal to the diameter of the hole that forms the microvia 4a. That is, the distance from the wall face of the through hole 3 to a portion that is included in the wall face of the hole forming the microvia 4a and is closest to the wall face of the through hole 3 is approximately equal to the distance from the wall face of the through hole 3 to a portion that is included in the wall face of the hole forming the inner via 4b and is closest to the wall face of the through hole 3.

Consequently, the distances from the through holes 3 to the microvias 4a and the inner vias 4b that are in a stack structure and are formed so as to surround the through holes 3 are equal and it is facilitated to adjust impedance in portions in the vias 4.

The impedance in a portion coupled through the through hole 3 is decided according to a distance L (see FIG. 3) between the through hole 3 and the via 4 arranged around the through hole 3. The via 4 has the ground potential of the antenna module 100 for example.

Figure 6:
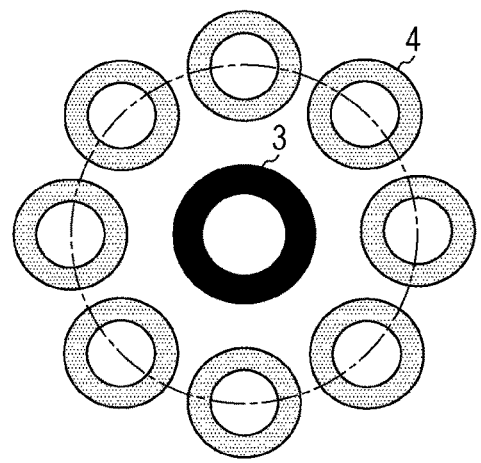
FIG. 6 is a top view that illustrates a variation of the antenna module according to the first embodiment.

As in a variation illustrated in FIG. 6, the vias 4 surrounding the through hole 3 may be arranged on an identical circumference while the through hole 3 is in the center of the circumference. Accordingly, the distances between the through hole 3 and all the vias 4 that are arranged around the through hole 3 and each have a stack structure of the microvia 4a and the inner via 4b are equal, and the adjustment of impedance is facilitated, which is caused in the vias 4. If some reason that arises in the manufacture hinders such arrangement, the arrangement is not limited thereto.

The microvias 4a in the outer layer (the first laminate plate 1a) and the inner vias 4b in the inner layer (from the second laminate plate 1b to the fourth laminate plate 1d) are arranged in the first laminate part 1 that uses the first electrical insulation base. Thus, poor coupling due to a difference in the coefficient of thermal expansion between the first electrical insulation base and the second electrical insulation base, which occurs when the microvias 4a and the inner vias 4b are coupled together, can be prevented and the reliability of the antenna module 100 can be enhanced.

As described above, arranging the vias 4 that each have a stack structure around the corresponding through holes 3 as in the first embodiment enables the antenna module 100 to have a configuration where, when the antenna module 100 includes a plurality of antenna elements, deficiencies in the plurality of antenna elements can be controlled, restraint-free arrangement with efficiency is possible as well as downsizing, and transmission loss between an RF chip and the antenna elements can be decreased.

Second Embodiment

A configuration of an antenna module 200 according to a second embodiment is described below using FIGS. 7 to 9.

Figure 7:
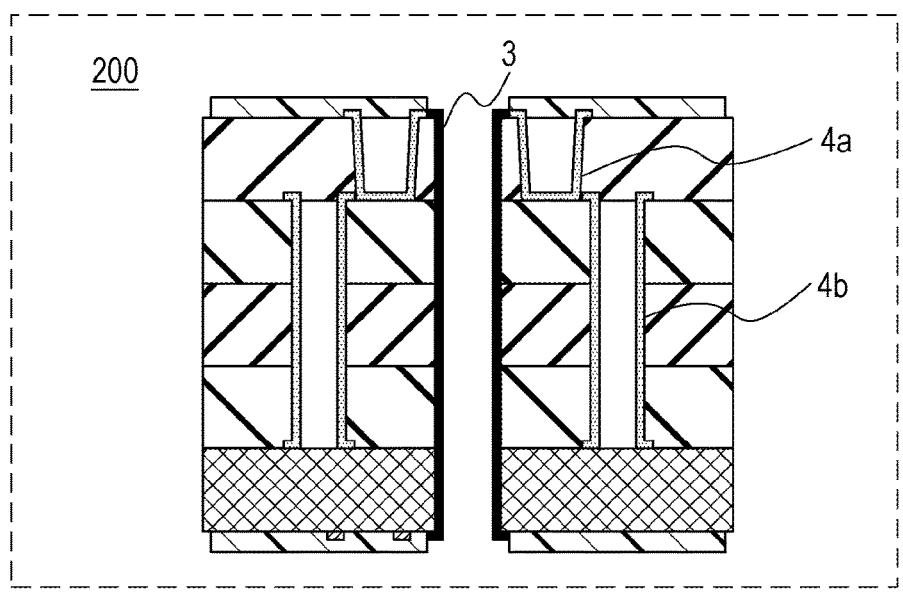
FIG. 7 is a cross-sectional view that illustrates an example of an antenna module according to a second embodiment.

FIG. 7 is a cross-sectional view that illustrates an example of the antenna module 200 according to the second embodiment. FIG. 8 is a cross-sectional view that illustrates a variation of the antenna module 200 according to the second embodiment. FIG. 9 is a cross-sectional view that illustrates another variation of the antenna module 200 according to the second embodiment.

The antenna module 200 according to the second embodiment is different from the antenna module 100 according to the first embodiment in that a microvia 4a formed in an outer layer and an inner via 4b formed in an inner layer are coupled in the thickness direction (the Y axis direction) of the antenna module 200 in a step-like structure instead of being coupled on an identical axis. The other constituents in the second embodiment are the same as those of the antenna module 100 according to the first embodiment.

In FIG. 7, the microvia 4a formed in the outer layer (a first laminate plate 1a) and the inner via 4b formed in the inner layer (from a second laminate plate 1b to a fourth laminate plate 1d) are coupled in a step-like (staggered) structure. That is, the distance between the microvia 4a and a through hole 3 is shorter than the distance between the inner via 4b and the through hole 3.

Figure 8:
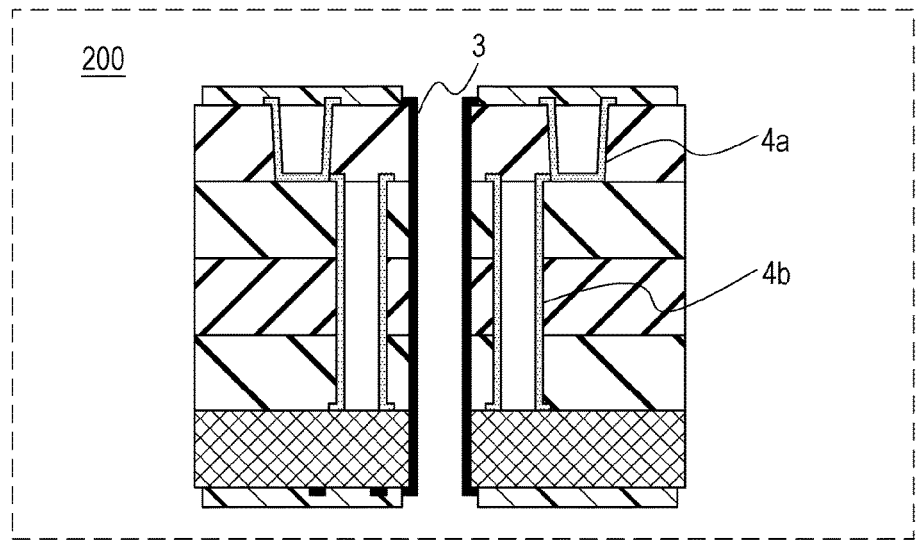
FIG. 8 is a cross-sectional view that illustrates a variation of the antenna module according to the second embodiment.

The microvia 4a formed in the outer layer and the inner via 4b formed in the inner layer may be coupled in a step-like structure illustrated in FIG. 8. In this case, the distance between the inner via 4b and the through hole 3 is shorter than the distance between the microvia 4a and the through hole 3.

The structures in FIGS. 7 and 8 can shorten lead time since lid plating, which is for blocking an opening by plating, is unnecessary after filling the inner via 4b with a conductive paste to make the inside of the inner via 4b full.

Figure 9:
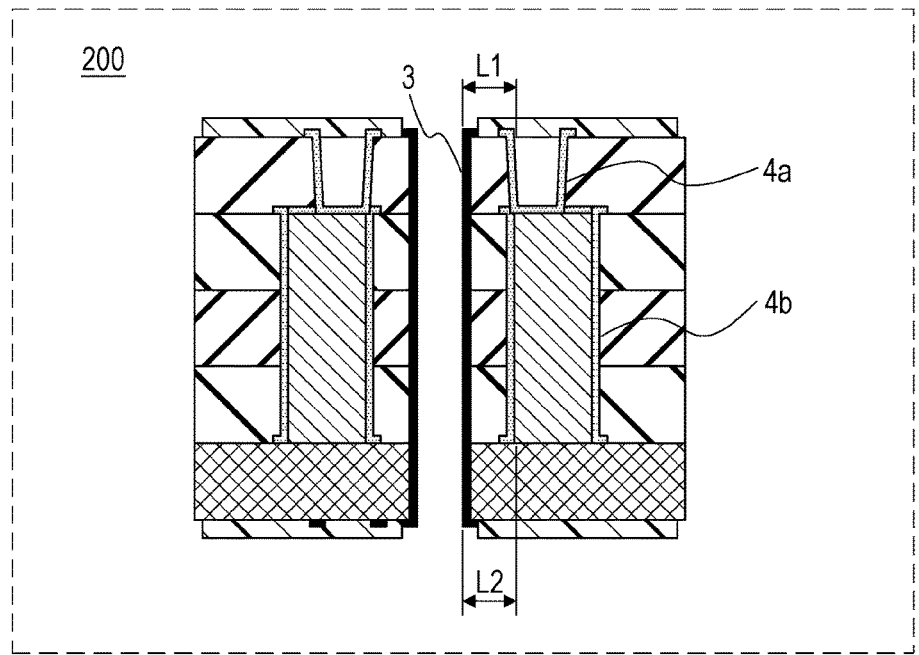
FIG. 9 is a cross-sectional view that illustrates another variation of the antenna module according to the second embodiment.

As illustrated in FIG. 9, the diameters of the microvia 4a and the inner via 4b may be made different and be stacked so that a distance L1 between hole walls of the through hole 3 and the microvia 4a is equal to a distance L2 between hole walls of the through hole 3 and the inner via 4b. In FIG. 9, the diameter of the microvia 4a is smaller than the diameter of the inner via 4b. Accordingly, the design and adjustment of impedance of the through hole 3 are facilitated.

Third Embodiment

A configuration of an antenna module according to a third embodiment is described below.

The third embodiment describes an antenna module where the permittivity and dielectric loss in a second laminate part 2 on which a phased array antenna is formed are smaller than the permittivity and dielectric loss in a first laminate part 1 on which matching circuits 9 are arranged.

To reduce loss in the transmission from antenna elements 6b, for example, the permittivity and dielectric loss are decreased. When the antenna area for a millimeter wave band is large, transmission loss can be inhibited by using a base of low permittivity and low dielectric loss.

Since such a base of low permittivity and low dielectric loss is expensive, increase in costs for the antenna module 100 can be avoided by using a base of low permittivity and low dielectric loss for the second laminate part 2 that is smaller in capacity of a material to be used than the first laminate part 1 as described above.

Similar to the first embodiment, the microvia 4a in the outer layer and the inner via 4b in the inner layer are formed in the first laminate part 1 that uses a first electrical insulation base. Accordingly, poor coupling due to a difference in the coefficient of thermal expansion between the first electrical insulation base and the second electrical insulation base, which occurs when the microvias 4a and the inner vias 4b are coupled together, can be prevented and the reliability of the antenna module 100 can be enhanced.

Fourth Embodiment

A configuration of an antenna module according to a fourth embodiment is described below.

In the fourth embodiment, the distance between a through hole 3 and each of vias 4 that are arranged around the corresponding through hole 3 and each have a stack structure of a microvia 4a and an inner via 4b is set to be shorter than or equal to ¼ of a wavelength λ of the transmission and reception frequencies of a phased array antenna.

When for example, an antenna that performs communication at 77 GHz (in a millimeter waveband) is provided and a PTFE base of permittivity of 3 is used as a second electrical insulation base, one wavelength propagated in the antenna module 100 is approximately 2.25 mm and the ¼ wavelength is approximately 0.56 mm.

Accordingly, when for example, the distance between the through hole 3 and the via 4 is caused to be shorter than or equal to 0.56 mm, the electromagnetic fields in the millimeter waveband, which spread out from the through holes 3, can be controlled and transmission loss can be reduced.

When in the through hole configuration with a conventional coaxial structure illustrated in FIGS. 10 and 11, a low-permittivity base is used and the distance between the through hole 104 and the impedance adjusting structure 106 is shorter than or equal to 0.56 mm, a crack occurs in a procedure of forming holes and the implementation becomes difficult.

According to the fourth embodiment, the use of the vias 4 arranged around the through hole 3 lowers the possibility of causing a crack in the base in a procedure of forming holes even when the distance between each through hole 3 and each via 4 is shorter than or equal to 0.56 mm, and transmission loss can be reduced by decreasing the distance between each through hole 3 and each via 4.

Fifth Embodiment

A configuration of an antenna module according to a fifth embodiment is described below.

The fifth embodiment describes a principal material of a second electrical insulation base where a phased array antenna is arranged and a principal material of a first electrical insulation base where matching circuits 9 are arranged as the same materials.

The permittivity of an electrical insulation base can be changed with the filling rate of a filler to be added, the diameter, and the material. Occurrences of failures in the manufacture, which include exfoliation in manufacturing a board, can be reduced by causing the principal material of the first electrical insulation base and the principal material of the second electrical insulation base to be identical, and the reliability of the antenna module can be enhanced. In addition, since it is facilitated to set the coefficient of thermal expansion and the modulus of elasticity to close values between the first electrical insulation base and the second electrical insulation base, warpage of the antenna module can be inhibited and the reliability in a process of mounting an RF chip can be enhanced.

Although embodiments of the present disclosure are described above, the present disclosure is not limited to the descriptions of the embodiments.

Although in each embodiment described above, the antenna module has a laminate structure constituted of the first laminate part and the second laminate part, the structure of the antenna module is not limited thereto. The structure may be for example, a structure where the antenna module is a single layer with one face that is provided with an RF chip and the other that is provided with a phased array antenna, and one of the faces of the antenna module may be provided with through holes that penetrate to the other face and non-penetrating vias that do not penetrate to the other face.

The present disclosure can be implemented using software, hardware, or software in cooperation with hardware.

Each functional block used in the description of the embodiments above can be partly or entirely implemented as a large-scale integration (LSI), which is an integrated circuit, and each process described above in the embodiments may be controlled partly or entirely by a single LSI or a combination of LSIs. Such LSIs may be formed as individual chips, or as a single chip so as to include part or all of the functional blocks. The LSI may include an input and an output of data. The LSI may be referred to as an IC, a system LSI, a super LSI, or an ultra LSI, depending on a difference in the degree of the integration.

The LSI is not a limited technique for the circuit integration, which may be achieved using a dedicated circuit, a general-purpose processor, or a special-purpose processor. A field programmable gate array (FPGA), which is programmable after the manufacture of the LSI, or a reconfigurable processor, which enables the connections and settings of circuit cells inside the LSI to be reconfigured, may also be utilized. The present disclosure may be implemented as digital processing or analogue processing.

Moreover, when other circuit integration techniques that can replace the LSI are brought as a result of the advancement of semiconductor techniques or other derivative techniques, the functional blocks may be integrated using such techniques of course. Biotechnology can be applied for example.

The antenna module according to the present disclosure is applicable to an antenna module that includes a plurality of antenna elements for millimeter wave signals.

What is claimed is:

1. An antenna module comprising:
    a multilayer board;
    a phased array antenna that includes a plurality of antenna elements arranged on an outer face of a second conductor layer included in the multilayer board and adjusts one or more beam directions of the plurality of antenna elements by controlling a phase of each of radio frequency signals transmitted from the plurality of antenna elements;
    a radio frequency (RF) chip that is arranged on an outer face of a plurality of first conductor layers included in the multilayer board and outputs the radio frequency signal;
    a matching circuit that is arranged on the outer face of the plurality of first conductor layers and adjusts matching between impedance of the plurality of antenna elements and impedance of the RF chip;
    a through hole that couples the plurality of first conductor layers and the second conductor layer; and
    one or more vias that are on an outer side in a diameter direction of the through hole and couples the plurality of first conductor layers.

2. The antenna module according to claim 1, wherein each of the one or more vias includes
    a first via arranged in an outer layer included in the plurality of first conductor layers, and
    a second via arranged in an inner layer included in the plurality of first conductor layers, and
    the first via and the second via are stacked on an identical axis.

3. The antenna module according to claim 1, wherein each of the one or more vias includes
    a first via arranged in an outer layer included in the plurality of first conductor layers, and
    a second via arranged in an inner layer included in the plurality of first conductor layers, and
    the first via and the second via are stacked on different axes.

4. The antenna module according to claim 2, wherein
a diameter of the first via and a diameter of the second via are equal to each other.

5. The antenna module according to claim 3, wherein
a diameter of the first via and a diameter of the second via are different from each other.

6. The antenna module according to claim 1, wherein
permittivity and dielectric loss of an electrical insulation base that forms the second conductor layer are smaller than permittivity and dielectric loss of an electrical insulation base that forms the plurality of first conductor layers.

7. The antenna module according to claim 1, wherein
a distance between the through hole and the each of the one or more vias is shorter than or equal to ¼ of a wavelength of a frequency of the radio frequency signal.

8. The antenna module according to claim 1, wherein
a principal material of an electrical insulation base that forms the plurality of first conductor layers and a principal material of an electrical insulation base that forms the second conductor layer are identical to each other.

* * * * *